United States Patent [19]
Itoh et al.

[11] Patent Number: 5,223,109
[45] Date of Patent: Jun. 29, 1993

[54] ION BEAM PROCESSING METHOD AND APPARATUS

[75] Inventors: Fumikazu Itoh, Fujisawa; Akira Shimase, Yokohama; Satoshi Haraichi, Yokohama; Junzou Azuma, Yokohama, all of Japan

[73] Assignee: Hitachi, Ltd, Tokyo, Japan

[21] Appl. No.: 766,328

[22] Filed: Sep. 27, 1991

[30] Foreign Application Priority Data

Sep. 27, 1990 [JP] Japan .................... 2-255360

[51] Int. Cl.⁵ ............................ H01J 27/00
[52] U.S. Cl. ..................... 204/192.34; 204/298.36; 156/643
[58] Field of Search .............. 156/643, 640, 659.1; 204/192.34, 298.36

[56] References Cited

U.S. PATENT DOCUMENTS

| | | | |
|---|---|---|---|
| 3,699,334 | 10/1972 | Cohen et al. | 204/298.36 X |
| 4,131,506 | 12/1978 | Namba et al. | 156/643 |
| 4,278,493 | 7/1981 | Petvai | 156/643 |
| 4,503,329 | 3/1985 | Yamaguchi et al. | 250/309 |
| 4,604,176 | 8/1986 | Paul | 204/192.34 |
| 4,609,809 | 9/1986 | Yamaguchi et al. | 219/121 EM |
| 4,683,378 | 7/1987 | Shimase et al. | 250/492.2 |
| 4,868,068 | 9/1989 | Yamaguchi et al. | 428/596 |
| 4,869,780 | 9/1989 | Yang et al. | 204/192.34 X |
| 4,936,968 | 6/1990 | Ohnishi et al. | 204/298.36 X |
| 5,035,770 | 7/1991 | Braun | 204/192.34 X |
| 5,091,048 | 2/1992 | Thomas | 204/298.36 X |

FOREIGN PATENT DOCUMENTS

| | | | |
|---|---|---|---|
| 2253253 | 6/1975 | France. | |
| 55-39646 | 3/1980 | Japan. | |
| 2-80569 | 3/1990 | Japan | 204/298.36 |

OTHER PUBLICATIONS

Crow et al, "The Use of Vector Scanning for Producing Arbitrary Surface Contours with a Focused Ion Beam", J. Vac. Sci. Technol., B6(5) Sep./Oct. 1988.

Primary Examiner—Thi Dang
Attorney, Agent, or Firm—Antonelli, Terry, Stout & Kraus

[57] ABSTRACT

There is disclosed an ion beam processing method of processing a rotating workpiece for a very small-size rotary member, using an ion beam or a focused ion beam. Apparatus for performing this method is also disclosed. In the formation of a product having a non-circular cross-section, when the amount of application of the ion beam is kept constant, the rotational angular velocity of the workpiece is varied in accordance with the rotational angular position of the workpiece. On the other hand, when the rotational angular velocity of the workpiece is kept constant, the amount of application of the ion beam is varied. When it is difficult to align the axis of the workpiece with the axis of rotation of a workpiece holder, the focused ion beam is applied in accordance with the oscillation of the workpiece.

5 Claims, 9 Drawing Sheets

FIG. 8A ($\theta$ = AROUND 90°, 270°)

FIG. 8B ($\theta$ = AROUND 0°, 180°)

ION BEAM PROCESSING METHOD AND APPARATUS

BACKGROUND OF THE INVENTION

1. Field of the Invention

This invention relates to an ion beam processing method of working or processing a rotary part of a very small size, such as a rotatable shaft having a diameter of about 10 μm, by an ion beam or a focused ion beam, and also relates to an ion beam processing apparatus for performing such a method.

2. Description of the Prior Art

Conventionally, when a workpiece for a component part of a very small-size machine is as small as 1 mm or less, or the configuration to be formed by the processing is on the order of μm, the workpiece, because of its very small size, does not have a sufficient strength for working stresses applied by ordinary machining, and therefore the workpiece is liable to be deformed during the working. Thus, it is difficult to work such a workpiece by ordinary machining. To overcome this difficulty encountered with the machining method, there has been proposed a method (as disclosed in the first page of Nikkei Industrial Newspaper issued Nov. 27, 1989) in which a groove with a width of 300 to 1,000 μm and a depth of 5-10 μm is formed in a shaft material with a diameter of 5 mm, using exposure and etching steps utilizing light.

On the other hand, as a technique for forming a very small-size groove (on the order of 10 μm or less) in a surface of a workpiece, there has been proposed a method utilizing a sputtering process using a focused ion beam, as disclosed in J. Vac. Sci. Technol. B6(5), Step/Oct 1988 ("The use of vector scanning for producing arbitrary surface contours with a focused ion beam"; G. Crow et al (Oregon Graduate Center)).

Also, of course, a lathe has been used for the machining by a cutting tool.

The above prior art performs the processing by two steps, that is, the exposure and the etching, and therefore has a problem that the process is a complicated. Further, with the etching, the patterns on the surface of the workpiece are all formed to the same depth, and therefore the etching is not suited for forming a groove of a complicated shape. For example, if the cross-sectional shape of the groove is tapered, a liquid can flow smoothly along the groove, and if the groove is so formed as to have a curvature, the concentration of stress on the material can be reduced; however, in the etching, unmasked portions are all removed to the same depth, and therefore it has been impossible to form a tapered groove and a curved groove.

The above prior art is directed to the formation of a complicate-shaped and very small-size groove using a focussed ion beam, and is suited for the processing of the flat surface, but is not suited for processing a rotary member.

Figure 3:
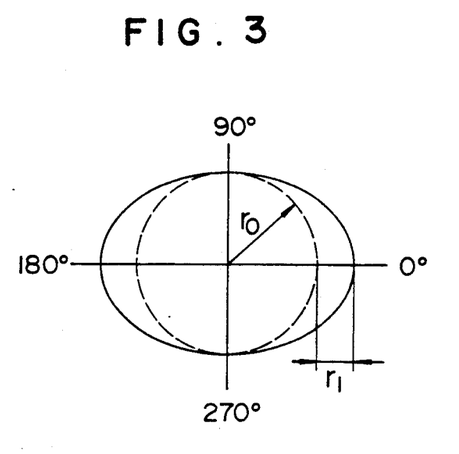
FIG. 3 is a front-elevational view of a rotary cam formed by the apparatus of FIG. 1.
Figure 4:
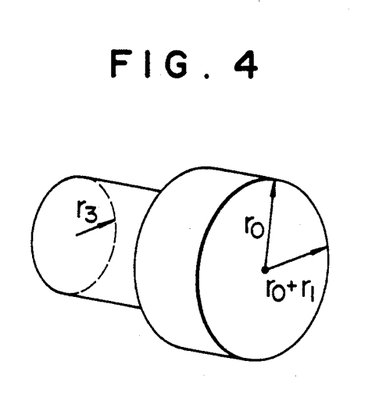
FIG. 4 is a perspective view of the rotary cam of FIG. 3.

Among constituent parts of a very small-size mechanism, there is a rotary cam. One example of such cam is shown in FIG. 3. This is a plate-like rotary cam in which $r_0$ represents a radius of a basic circle, and $r_1$ represents the amount of lift at the angles of 0° and 180°. This cam is the component part of a very small-size mechanism having the radius $r_0$ of about 10 μm, and is integral with a shaft having a radius $r_3$ ($\leq 10$ μm), as shown in FIG. 4. It has been impossible to form such a component part by machining, etching and an ordinary ion beam processing.

SUMMARY OF THE INVENTION

It is an object of this invention to provide an ion beam processing method which can form a very small-size rotary member of a complicated shape by a simple process.

Another object of the invention is to provide an ion beam processing apparatus which can form a very small-size rotary member, using an ion beam or a focused ion beam.

To achieve the above objects, in the present invention, an ion beam or a focused ion beam is applied to a rotating workpiece to process the workpiece.

For forming a product having a non-circular (for example, ellipse) cross-section, the rotational angular velocity is varied in accordance with the rotational angular position of the workpiece, and the amount of application of the ion beam is kept constant.

When the workpiece of a very small size is rotated, it is difficult to align the axis (center line) of the workpiece with the axis of rotation on the order of μm. Therefore, in this case, an oscillation of the workpiece occurs. To deal with this, the focused ion beam is applied in accordance with the oscillation of the workpiece.

In the above processing using the ion beam, only the necessary portion can be processed by the focused ion beam or the like, and therefore the product of a complicated shape can be formed without the use of two steps, that is, exposure and etching.

The ion beam is applied to the workpiece while rotating the workpiece, and the workpiece of a very small size is not subjected to such a large cutting force as produced in a cutting process using a cutting tool such as a bit. Therefore, the rotating member can be easily processed without receiving a large deformation.

Further, by varying the rotational angular velocity of the workpiece in accordance with the rotational angular position, the amount of application of the ion beam, i.e. the amount of processing, to the surface of the workpiece can be varied from one portion of the workpiece to another, and therefore a non-circular (for example, ellipse) cross-sectional shape can be obtained.

Further, even if the oscillation of the workpiece occurs as described above, this vibration is a sinusoidal one, and therefore the focused ion beam can easily follow the oscillation by deflecting the focused ion beam.

DETAILED DESCRIPTION OF THE PREFERRED EMBODIMENTS

Preferred embodiments of the present invention will now be described with reference to FIGS. 1 to 22.

Figure 1:
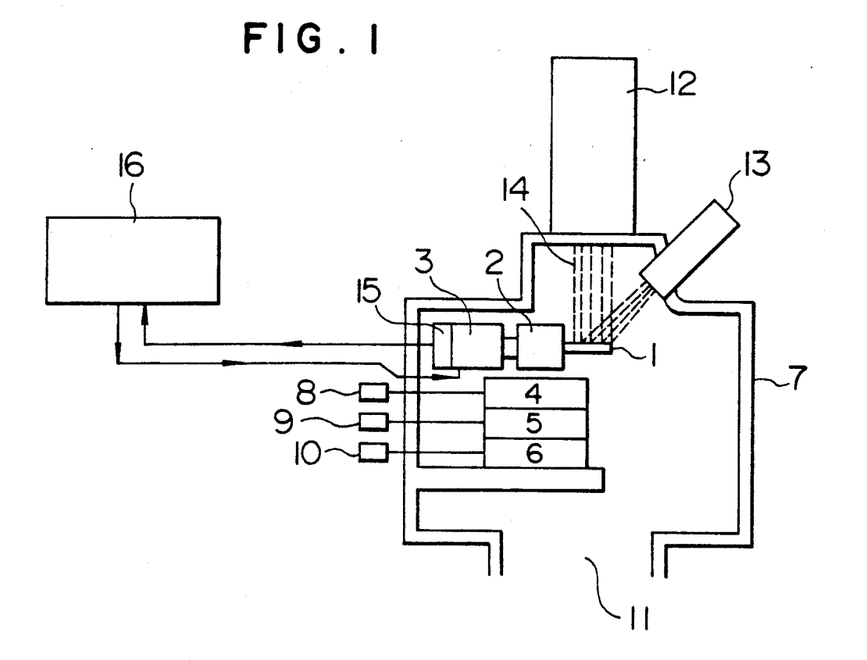
FIG. 1 is a cross-sectional view of an ion beam processing apparatus according to one embodiment of the present invention.
Figure 2:
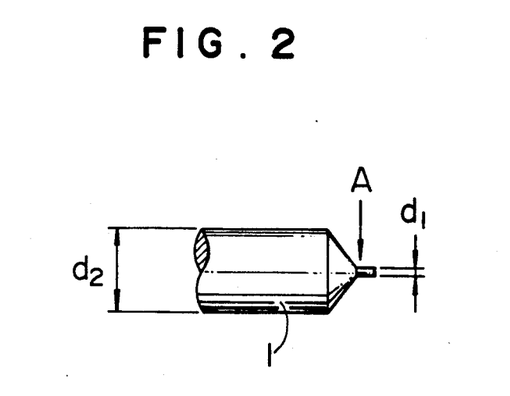
FIG. 2 is a front-elevational view of one example of a workpiece used in the apparatus of FIG. 1.

FIG. 1 is a schematic cross-sectional view of an ion beam processing apparatus and performing an ion beam processing method according to an embodiment of the invention. In FIG. 1, a cylindrical workpiece 1 is held by a rotatable chuck 2, and is driven by a motor 3 to be rotated. The chuck 2 and other parts each are mounted on X-, Y- and Z-tables 4, 5 and 6. The workpiece 1, the chuck 2, the motor 3 and the tables 4, 5 and 6 are provided within a vacuum chamber 7. X-, Y- and Z-positions of the workpiece 1 can be adjusted by micrometer heads 8, 9 and 10, respectively. The vacuum chamber 7 is evacuated to vacuum by a vacuum pump (not shown) via an evacuation port 11. An ion gun 12 is mounted on the vacuum chamber 7. The ion gun 12 applies an ion beam 14 of Ar etc. at an acceleration voltage of several KV to several hundreds of KV, and is suited for sputtering processing for the workpiece. Actually, the ion beam is applied at a voltage of 10 to 50 KV. If the workpiece 1 has the diameter of 10 $\mu$m and the length of 100 $\mu$m, the diameter of the ion beam is 1 to 10 mm. If the diameter of the workpiece 1 is about 10 $\mu$m, it is difficult to hold the workpiece 1. Therefore, in this case, the chucking portion of the workpiece 1 has an enlarged diameter $d_2$ of about 1 mm, and the processing portion of the workpiece 1 has a desired diameter $d_1$ (for example, 10 $\mu$m < $d_1$ < 100 $\mu$m), and the portion A (FIG. 2) is cut off after the processing. If the workpiece 1 is made of an electrically-insulating material, the workpiece 1 is charged up by the applied ion beam, so that it becomes difficult to process the workpiece 1. Therefore, a charge neutralization electron gun 13 is mounted on the vacuum chamber 7.

In an embodiment of a processing method using this ion beam processing apparatus, the workpiece 1 is rotated by the motor 3 while the ion beam 14 is applied to the workpiece 1, so that the ion sputtering is applied uniformly to the surface of the workpiece 1, thereby processing the workpiece into a cylindrical shape. Evaluation of the finish of the processed workpiece is made based on the time determined through calculation from the size of the workpiece before the processing, using the processing speed per unit time which is found beforehand through experiment. Alternatively, as later described with respect to FIG. 9, the evaluation may be made by observation of the cross-sectional surface of the workpiece perpendicular to the axis thereof as viewed from the right side, using an optical microscope.

In the processing method of this embodiment, the ion beam density can be easily made uniform in the range sufficiently large as compared with the diameter of the workpiece and the amount of oscillation of the axis, so that the workpiece can be processed into accurate roundness even if a slight oscillation is encountered. Therefore, this processing method is more suited for processing the workpiece of a very small diameter, as compared with the processing by a lathe. The processing speed is lower with this processing method than with lathe machining; however, since the processing force is extremely small, this processing method is suited for processing the workpiece of a very small diameter.

Next, a processing method of forming a product of a non-circular (for example, ellipse) cross-section, such as a rotary cam as shown in FIGS. 3 and 4, using the ion beam processing apparatus of FIG. 1 will now be described. An encoder 15 is connected to the motor 3 so as to detect the rotational angular position of the motor 3. A controller 16 for the motor 3 controls it in such a manner as to vary the rotational angular velocity of the motor 3 in accordance with this rotational angular position. A workpiece having a circular or round cross-section is rotated in such a manner that the angular velocity is the maximum at the angular positions of 0° and 180° and is the minimum at the angular positions of 90° and 270°, and in this condition the ion beam 14 is applied to the workpiece, so that the processing amount is the minimum at the angular positions of 0° and 180°. Therefore, the workpiece is processed into a generally ellipse shape having a longer diameter of 2×($r_0+r_1$) (which is disposed on the axis on which the angular positions of 0° and 180° are disposed) and a shorter diameter of $2r_0$ which is disposed on the axis on which the angular positions of 90° and 270° are disposed.

Figure 5:
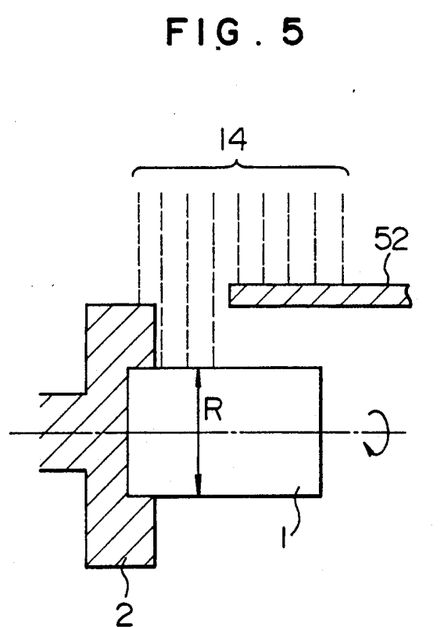
FIGS. 5 and 6 are illustrations showing a method of forming the rotary cam of FIG. 3.
Figure 6:
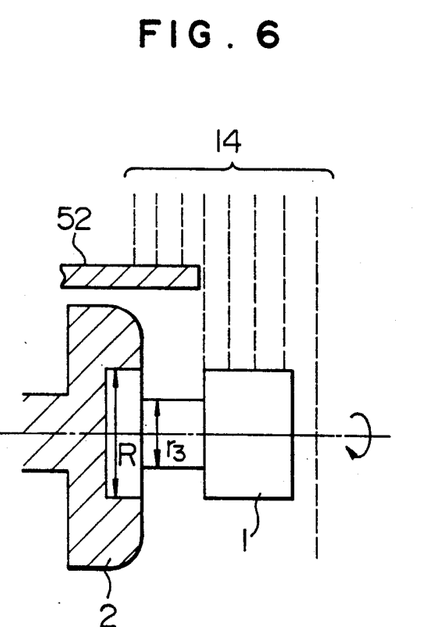
Figure 7:
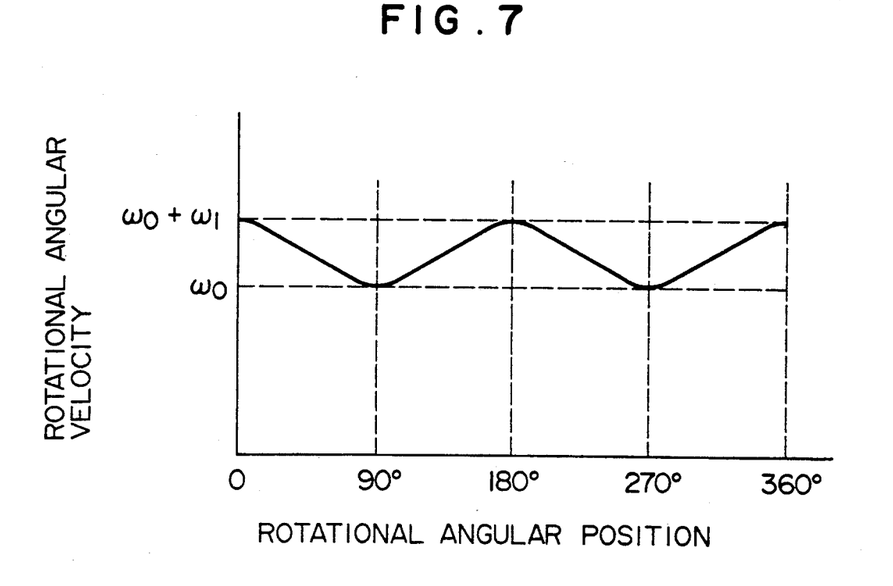
FIG. 7 is a graph showing a rotational angular velocity of a chuck of FIG. 6.

FIGS. 5 and 6 show the process of forming this rotary cam. Here, the diameter of the workpiece 1 is represented by R. First, for processing the shaft portion, the workpiece 1 is attached to the chuck 2, and as shown in FIG. 5, the distal portion (the right portion in FIG. 5) of the workpiece 1 is covered with an aperture member 52 so that the ion beam 14 will not be applied to this distal portion. Then, the workpiece 1 is rotated at a constant angular velocity, and the ion beam is applied until the shaft portion is formed into a diameter of $r_3$. Then, as shown in FIG. 6, the thus processed portion is covered with the aperture member 52 so as not to receive the ion beam 14. Then, as shown in FIG. 7, the rotational angular velocity of the chuck 2 is varied between $\omega_0$ and $\omega_0+\omega_1$ in accordance with the rotational angular position, so that there can be obtained the ellipse-like shape (as shown in FIG. 3) having the longer diameter, disposed on the axis on which 0° and 180° are disposed, and the shorter diameter disposed on the axis on which 90° and 270° are disposed. Finally, the workpiece 1 is detached from the chuck 2, and that portion (which has the diameter of R) left so as to extend in a left direction from the shaft portion is removed by sandpaper, lapping or the like.

Figure 8A:
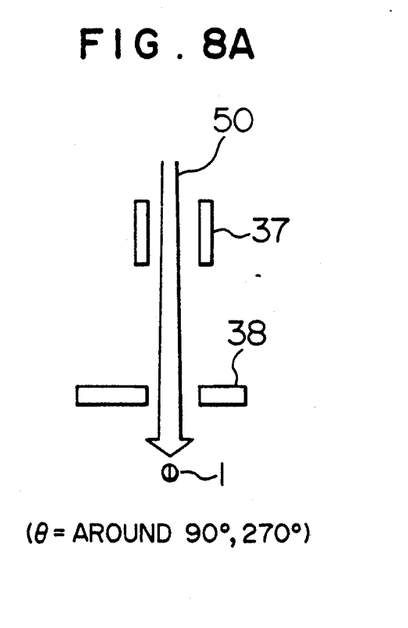
FIGS. 8A and 8B are illustrations showing the blanking of the ion beam used for forming the rotary cam of FIG. 3.
Figure 8B:
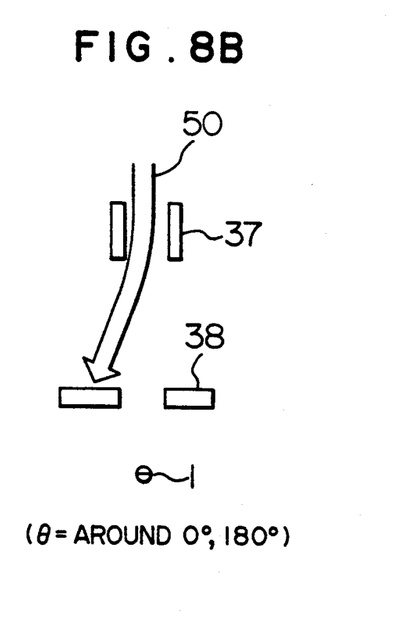

According to another embodiment, the rotational angular velocity is not changed in contrast with the above embodiment, and the aperture member 52 is advanced and retracted in accordance with variations of the rotational angular position of the workpiece 1 to turn on and off the application of the ion beam, so that the processing is performed only at predetermined angular positions. As a result, the rotary cam of such a shape as shown in FIG. 3 can be obtained. With the sputtering process by the ions, it is not necessary to rotate the workpiece at such high speed as required for a lathe, and therefore the aperture member 52 can be mechanically moved easily in accordance with the rotational angular positions. The means for switching the ion beam application between the ON and OFF state may not depend on the mechanical means such as the aperture member, but may be depend on a blanking electrode 37 (as shown in FIGS. 8A and 8B) in which case the ion beam 14 is deflected by this electrode, so that the ion beam is applied to the workpiece 1 in the vicinity of 90° and 270° whereas the ion beam impinges on a blanking aperture member 38 in the vicinity of 0° and 180°, thereby turning on and off the application of the ion beam 14.

Figure 9:
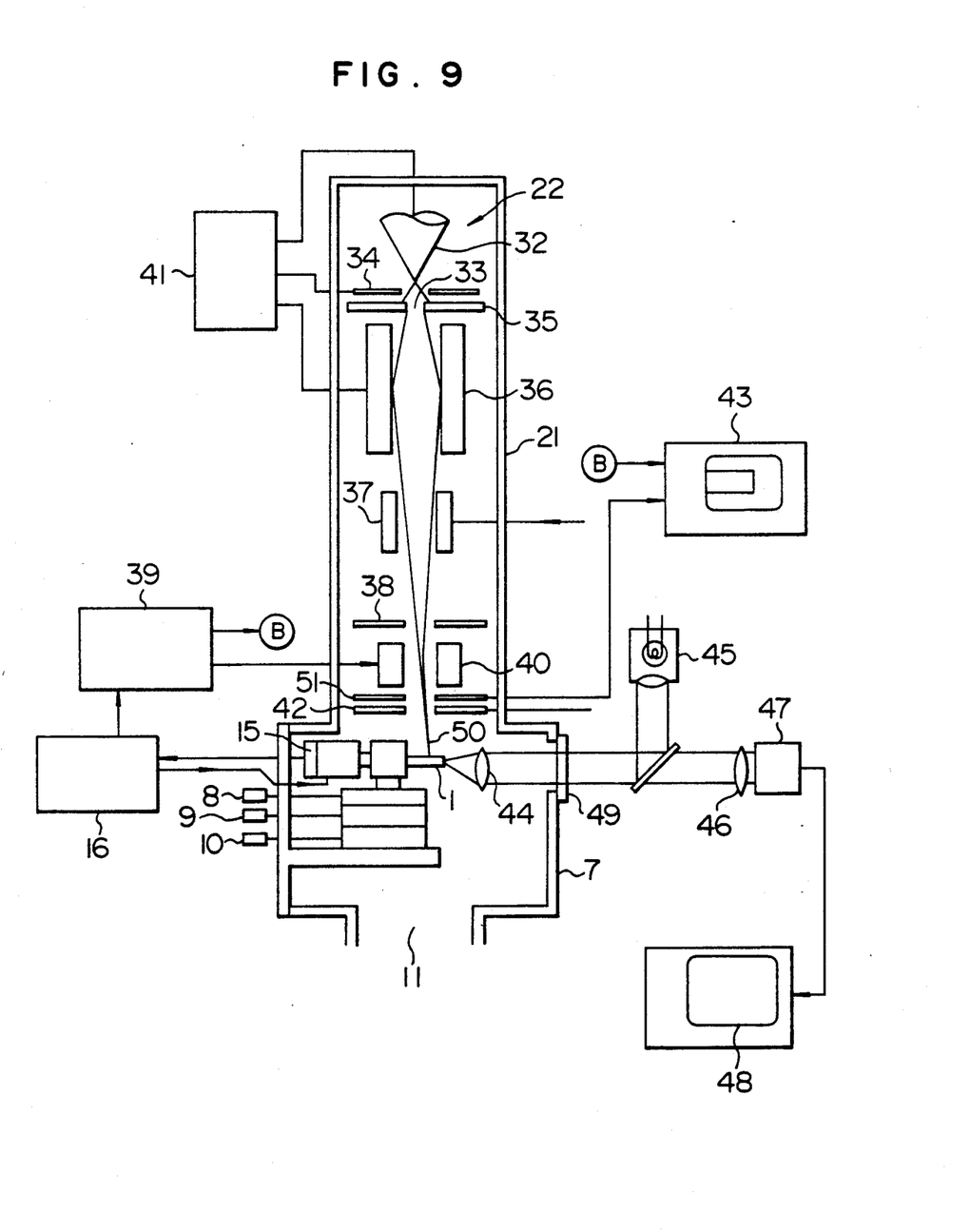
FIG. 9 is a schematic cross-sectional view of a focused ion beam processing apparatus according to another embodiment of the present invention.

FIG. 9 is a schematic cross-sectional view of a focused ion beam processing method and an apparatus for performing the method according to an embodiment of the present invention. Stages and a chamber in FIG. 9 are similar to those of FIG. 1. A focused ion beam mirror tube 21 is mounted on the chamber 7. An ion beam source 22 is mounted within the chamber 7, and comprises a liquid metal ion source 32 (for example, comprising a needle, typically made of tungsten, having Ga coated on its distal end), a drawing electrode 34 for drawing an ion beam 33 from the ion source 32, a control aperture member 35, an electrostatic lens 36 for focusing the ion beam 33 passed through the aperture member 35, a blanking electrode 37, a blanking aperture member 38, and a deflection electrode 40 connected to a deflection controller 39. A control power source 41 controls the electric potentials of the liquid metal ion source 32, the drawing electrode 34 and the electrostatic lens 36. A microchannel plate (MCP) 42 and an anode 51 are mounted just above a workpiece 1. The microchannel plate 42 amplifies secondary particles (ions or electrons), emitted from the workpiece 1 upon application of ions thereto, to provide a large electron current, and the anode 51 receives this electron current. In response to a signal from the anode 51 and a signal from the deflection controller 39 (passing through a line Ⓑ in FIG. 9), a scanning ion microscope image (SIM image) is displayed on a Braun tube 43. An objective lens 44, an illumination source 45, an ocular lens 46 and a camera 47 for an optical microscope are provided on the right side of the workpiece 1, and the position of the axis of the workpiece 1 and the shape of this axis are displayed on an optical microscopic image monitor 48. The objective lens 44 is disposed on the left side of a vacuum partitioning glass plate 49, that is, within the vacuum chamber 7.

Figure 17A:
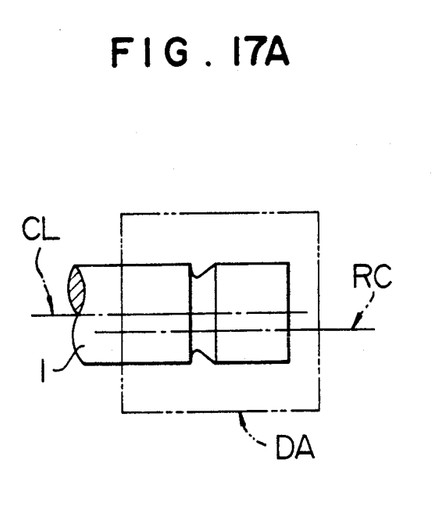
FIGS. 17A and 17B are illustrations showing one example of a SIM image of the workpiece processed by the apparatus of FIG. 9.
Figure 17B:
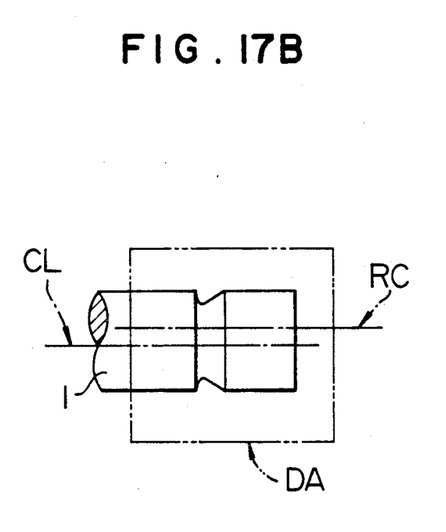

In an embodiment of the processing method using this focused ion beam processing apparatus, the focused ion beam 50 has an energy voltage of 10 to 50 KV, an electric current of 0.1 to 10 nA and a diameter of about 0.03 $\mu$m to about 2 $\mu$m. For applying this beam to the workpiece 1 having a diameter of around 10 $\mu$m, a region sufficiently large (for example, of 1 mm $\times$ 1 mm) to include the workpiece 1 is raster-scanned by the focused ion beam 50, so that the SIM image of the workpiece 1 is obtained on the Braun tube 43. While viewing this image, the positions of X- and Y-tables 4 and 5 are adjusted so as to bring the workpiece 1 to the center of the screen, so that the workpiece 1 can be brought into a position right beneath the axis of the focused ion beam. Then, while observing the high-magnification SIM image of the surface of the workpiece 1, the voltage of the electrostatic lens 36 is adjusted for focusing so that this image can be viewed clearly. If the height of the workpiece 1 is much displaced out of position, so that the focusing is difficult, the position of a Z-table 6 is adjusted, and then the focusing is effected again. Thereafter, while rotating the workpiece 1, the focused ion beam 50 is applied to that portion of the workpiece 1 where a groove is to be formed. When it is desired to form a groove of a varying depth as shown in FIGS. 17A and 17B, a larger amount of the ion is applied to a deeper portion of the groove whereas a smaller amount of the ion is applied to a shallower portion thereof.

Figure 10:
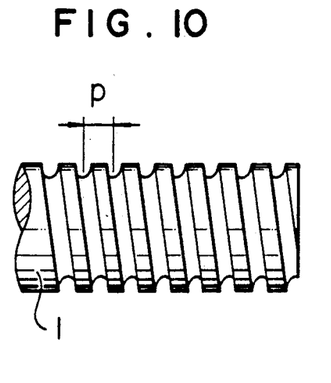
FIG. 10 is a front-elevational view of one example of a shape of a product formed by the apparatus of FIG. 9.
Figure 11:
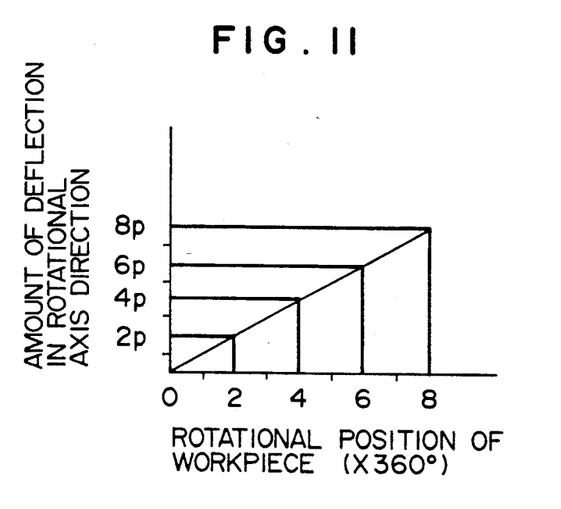
FIG. 11 is a graph showing the manner of applying the focused ion beam to obtain the shape of the product of FIG. 10.

A further embodiment of a processing method of the invention will now be described with reference to FIGS. 10 to 15. FIG. 10 shows a product in which a screw-like groove is formed in a cylindrical surface. For processing a workpiece to obtain this product, the amount of deflection of the focused ion beam 50 in the direction of the axis of rotation is varied at a cycle of a pitch P in accordance with the rotational position of the workpiece, as shown in FIG. 11. To achieve this, the rotational angular position of the workpiece is read by an encoder 15 and a motor-controller 16, and this data is fed to the deflection controller 39, and under the control of the deflection controller 39, the deflection voltage is applied to the deflection electrode 40 is in accordance with the relation shown in FIG. 11. In order to reduce the re-deposited substance due to the sputtering process, it is preferred that this scanning be repeated over and over again so as to effect the processing little by little in one process.

Figure 12:
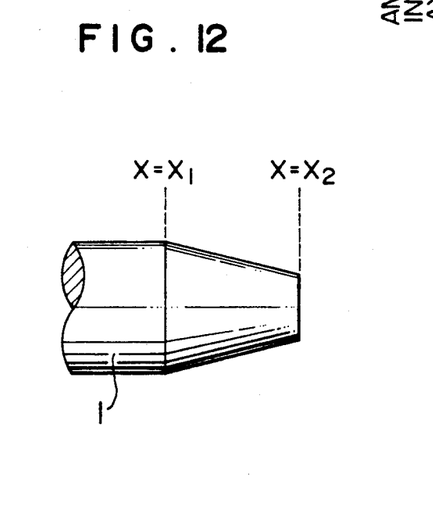
FIG. 12 is a front-elevational view showing another example of a workpiece processed into another shape.
Figure 13:
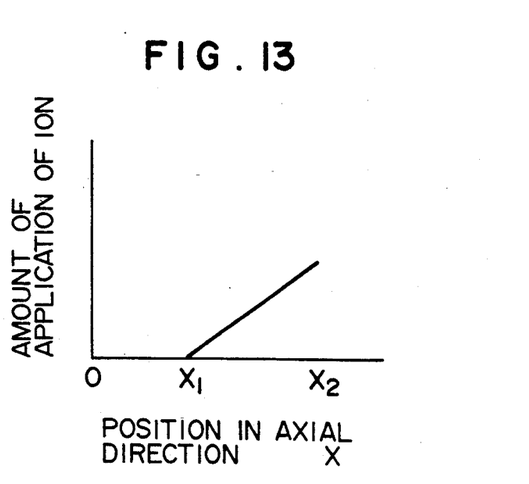
FIG. 13 is a graph showing the manner of applying the focused ion beam to obtain the shape of the processed workpiece of FIG. 12.

FIG. 12 shows a product formed by processing a workpiece into a tapered shape in an axial direction from a position $x=x_1$ to a position (distal end) $x=x_2$. For processing the workpiece to obtain this product, the amount of application of the ion is increased gradually from the position $x=x_1$ to the position $x=x_2$, as shown in FIG. 13. To achieve this, the amount of application of the ion need to be increased in proportion to $x-x_1$. The amount of application of the ion at a certain position x is inversely proportional to the scanning speed dx/dt of the focused ion beam 50 in the x-direction, and therefore the following formula is provided:

$$1/(dx/dt) = k(x - x_1)$$

where k represents a constant of proportionality.

Form this formula, assuming that $x = x_2$ is provided at $t = 0$ and that $x = x_1$ is provided at $t = t_1$, the following formula is obtained:

$$x = k'(t - t_1)^{\frac{1}{2}} + x_1$$

Figure 14:
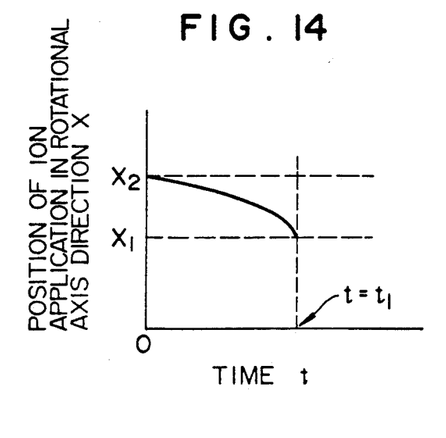
FIG. 14 is a graph showing a modified method of applying the focused ion beam to obtain the shape of the processed workpiece of FIG. 12, i.e. showing a relation between applied positions of the focussed ion beam and time.

Therefore, the scanning as shown in FIG. 14 is performed. In this case, the re-deposition due to the sputtering process is not taken into consideration, and therefore in order to reduce the re-deposition, it is preferred that the scanning by the beam be done from the position $x = x_2$ (where the processing amount is large) toward the position $x = x_1$.

Figure 15:
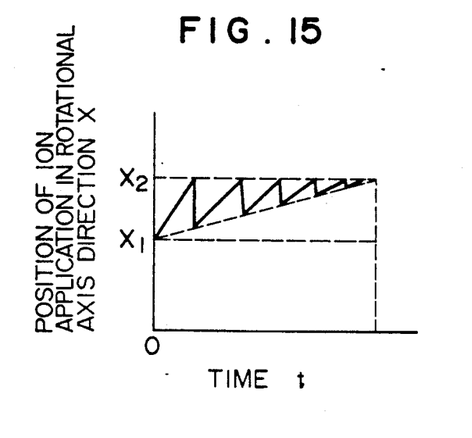
FIG. 15 is a graph showing the relation between the position of application of the focused ion beam and time according to a further modified method of applying the focused ion beam.

Alternatively, as shown in FIG. 15, the tapered configuration can also be obtained by displacing the starting point of the scanning gradually from the position $x_1$ toward the position $x_2$, while keeping the scanning speed dx/dt constant. In this case, also, the tapering can be performed better by repeating the scanning by the focused ion beam 50 over and over again so as to effect the processing little by little. The reason for this is that with a slow processing, only that portion which is being processed is dug deeply, so that the re-deposition is liable to occur.

Next, an embodiment of a processing method of the invention, in which the focussed ion beam is deflected in accordance with the oscillation of a workpiece due to its eccentric, will now be described with reference to FIGS. 16 to 19. It is unavoidable that the eccentricity of the axis (centerline) CL of the workpiece 1 deviates from about the axis Rc of rotation of the chuck (holder) 2 is on the order of 10 μm. If the workpiece has a diameter of 1 mm or more, this eccentricity does not pose any serious problem; however, if the amount of the eccentricity becomes almost equal to the diameter of the workpiece, the focused ion beam 50 fails to impinge on the workpiece 1. Also, even if the focused ion beam 50 impinges on the surface of the workpiece, the angle between the surface of the workpiece and the ion beam is not constant, so that the processing is adversely affected. Therefore, when the workpiece 1 of a very small size is to be processed through rotation thereof, it is necessary that the position of application of the focused, ion beam 50 be displaced in accordance with the oscillation of the workpiece caused by the eccentricity.

Figure 16A:
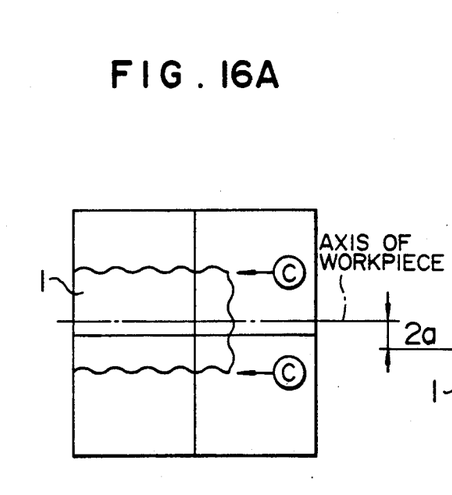
FIGS. 16A and 16B are illustrations showing one example of a SIM image of the workpiece used in the apparatus of FIG. 9.
Figure 16B:
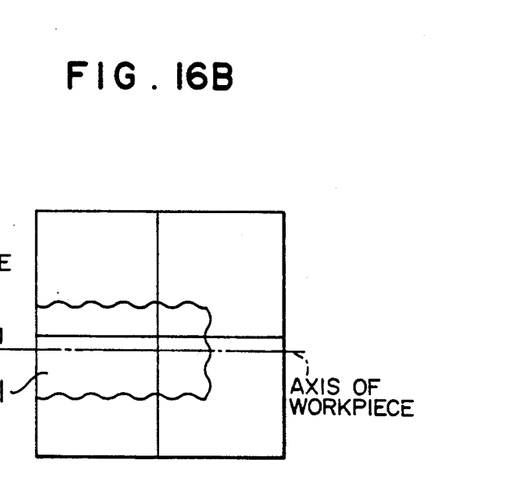
Figure 18:
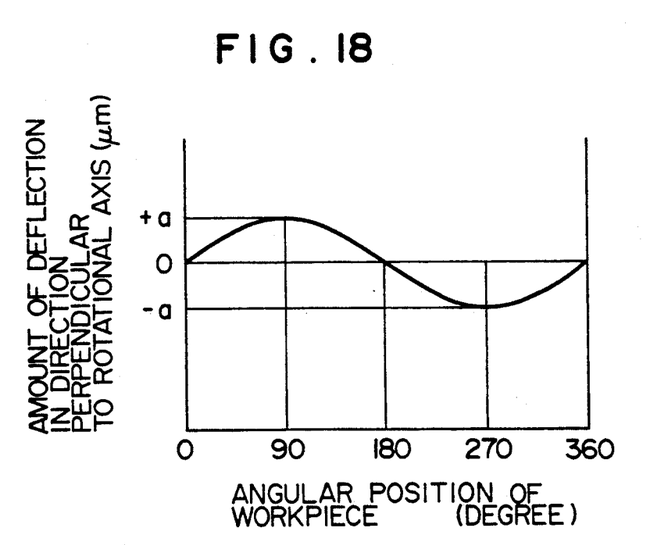
FIG. 18 is a view showing the manner of deflecting the focused ion beam so as to process the workpiece of FIGS. 17A and 17B.

To achieve this, as shown in FIGS. 16A and 16B, the upper limit (FIG. 16A) and lower limit (FIG. 16B) of the oscillation of the workpiece 1 are observed through the SIM image to find the difference 2a between the two limits. The amount of the oscillation obtained from the SIM image is inputted to the deflection controller 39, and also the angular positions of the workpiece 1 respectively providing the upper limit and lower limit of the oscillation are read from the encoder 15, and are inputted to the deflection controller 39. Based on these input data, with reference to the angular position data (which varies with time) from the motor controller 16, the deflection controller 39 applies, to the focused ion beam 50, the sinusoidal deflection amount of the amplitude 2a corresponding to the oscillation of the workpiece 1 in accordance with the angular position of the workpiece 1, as shown in FIG. 18. By doing so, the focused ion beam impinges uniformly on the workpiece 1, so that the processing can be carried out satisfactorily.

This method is also used for observing the configuration of the processed workpiece 1 through the SIM (Scanning Ion Microscope) image while rotating the workpiece. 1 More specifically, as shown in FIGS. 17A and 17B, when the configuration of the processed workpiece 1 is observed by deflection scanning of the focused ion beam 50, the SIM image oscillates upward and downward. Therefore, by moving this deflection area DA upward, and downward in conformity with the oscillation of the workpiece 1, the SIM image can be observed without the eccentricity of the workpiece, and this is desirable.

Figure 19:
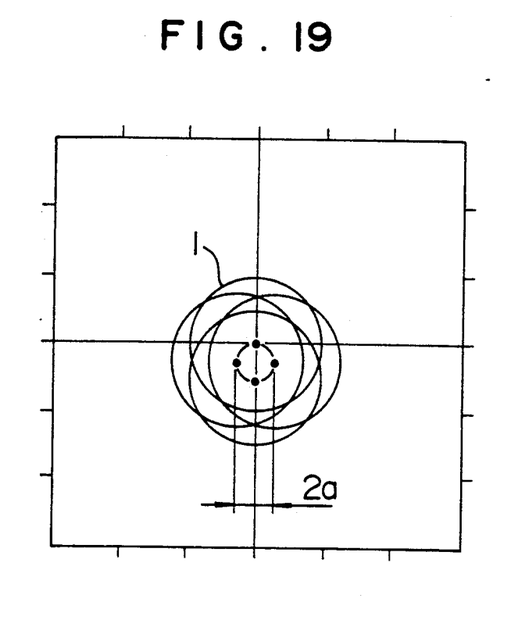
FIG. 19 is a view of the workpiece in FIG. 9, as viewed in the axial direction through an optical microscope.

In ,the above method in which the amount of eccentric radius of the workpiece is measured by the use of the above-mentioned SIM image, the end portion of the cylinder 1 as shown by ⓒ in FIG. 16A can not be measured clearly. Therefore, there is another measurement method by which the workpiece 1 is observed in the axial direction by the optical microscope, as shown in FIG. 9. With this measurement method, as shown in FIG. 19, the manner of eccentricity of the circular end face of the workpiece 1 during the rotation of the workpiece can be observed clearly. Therefore, the eccentric diameter 2a can be measured.

Figure 20:
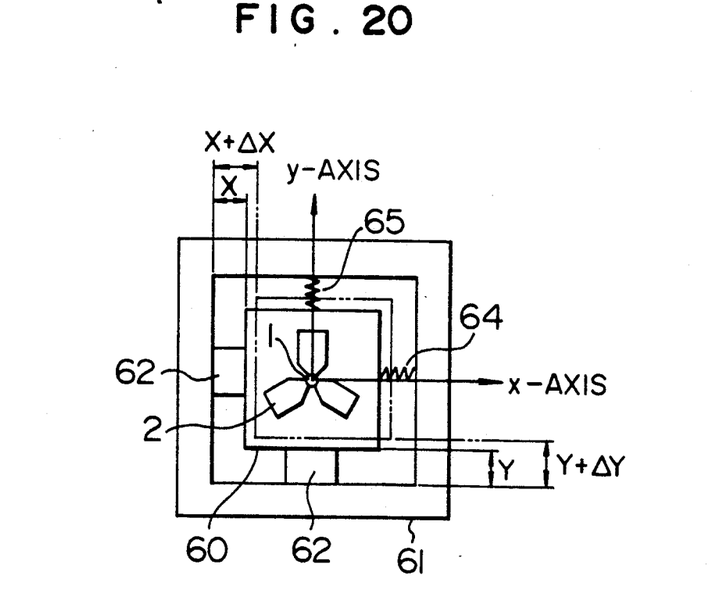
FIG. 20 is a front-elevational view of one example of a chuck mechanism of the apparatus of FIG. 9.

In the above embodiments, the position of the focused ion beam 50 is changed in accordance with the eccentricity of the workpiece 1. In contrast, there is another method in which a workpiece is positioned more precisely. A further embodiment of the invention directed to such a method is shown in FIG. 20. FIG. 20 is a view showing the workpiece 1 and a chuck 2, as seen in the axial direction. A chuck holder 60 is supported in an outer frame 61 by piezoelectric elements X 62 and Y 63 and springs X 64 and Y 65, and the chuck holder 60 is rotated, together with the outer frame 61, about a rotation axis. The x-axis direction represents an angular position of 0°, and the y-axis direction represents an angular position of 90°. The relation between the amount of eccentricity of the workpiece and the angular position is detected by the above-mentioned method, and then based on a component ΔX in the x-axis direction (the direction of 0°) and a component ΔY in the y-axis direction (the direction of 90°), voltage is applied to the piezoelectric elements X 62 and Y 63 to displace the chuck holder 60 relative to the outer frame 61, thereby reducing the eccentricity of the workpiece 1 to a sufficiently small value. The mechanism using the piezoelectric elements is not so rigid as to withstand a cutting force applied by an ordinary cutting tool; however, in the ion beam processing of the present invention, the processing force is very weak, and therefore there is no problem.

In the above embodiments, although the angle between the ion beam axis and the axis of rotation of the workpiece is 90°, this angle is not limited to 90°. Particularly when this angle is 0°, this arrangement is suited for forming a circumferential groove in a surface of a workpiece, and can be used, for example, for forming a Fresnel lens or the like. In this case, also, the method of correcting the deviation of the axis of the workpiece from the rotation axis is effective.

When the processing is performed for a long time by the application of the ion beam, the temperature of the workpiece rises, and therefore the chuck 2 can have a cooling function.

Figure 21:
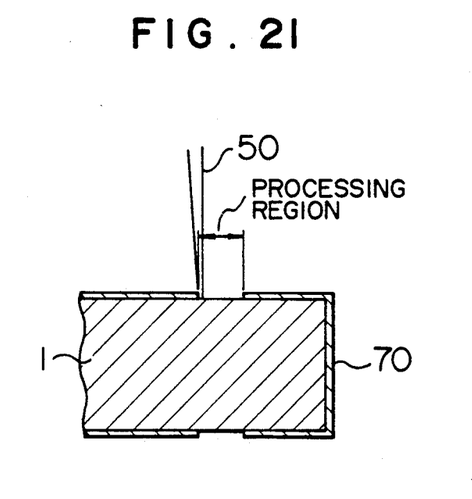
FIGS. 21 and 22 are axial cross-sectional views of the workpiece used in FIG. 9 but having a film-like coating thereon, showing a method of forming a fine pattern using the ion beam processing and an etching process.
Figure 22:
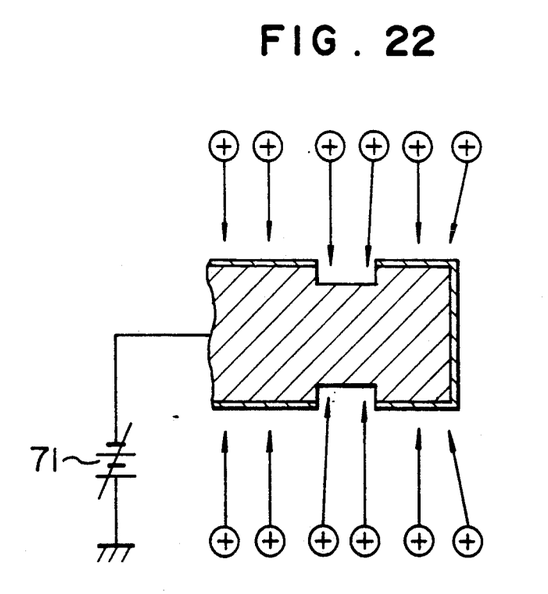

According to a further embodiment of the present invention shown in FIG. 21, a resist (for example, a film of Cr) 70 is coated on a surface of a workpiece 1 made, for example, of Si or $SiO_2$, and part of the resist 70 is removed by sputtering of a focused ion beam 50 to expose the workpiece 1. Then, as shown in FIG. 22, the workpiece is etched in a etching gas plasma. In this case, a bias voltage 71 is applied to the workpiece, so that the etching ions are attracted to the workpiece with directional properties, thereby performing the processing achieving a high an isotropy, as is the case with an ordinary reactive ion etching (RIE).

In the above embodiments, although only the sputtering processes using the ions have been described, the invention can also be applied to an ion beam (or focused ion beam) assist etching process in which the process of the above embodiments is carried out by the addition of etching gas. For example, in the case of the ion beam processing of a workpiece of $SiO_2$, when $XeF_2$ gas is sprayed to the workpiece, there can be achieved the processing which is proportional to the amount of application of the ion and the amount of processing the workpiece per the amount of application of the ion is more than 10 times as efficient as the sputtering processing.

According to the present invention, the very small-size rotary member can be processed by the simple process using only the ion beam processing. And besides, since the groove of a complicated shape can be formed, those constituent parts of very small-size devices which have been difficult to be worked by conventional machining and light-exposure can be easily formed.

What is claimed is:

1. An ion beam processing method comprising the steps of rotating a workpiece; and applying an ion beam to said rotating workpiece to process said workpiece by said applied ion beam; wherein said ion beam is applied to said rotating workpiece while periodically varying the speed of rotation of said workpiece, thereby processing said workpiece into a product having a generally ellipse cross-sectional shape through a plane disposed perpendicular to the axis of rotation of said workpiece.

2. An ion beam processing method comprising the steps of rotating a workpiece; and applying a focused ion beam to said rotating workpiece to process said workpiece by said applied focused ion beam, wherein an amount of application of said focused ion beam to said workpiece is varied by deflecting said focused ion beam in accordance with a non-linear function of rotational position of the rotating workpiece to which said focused ion beam is applied.

3. A method according to claim 2, wherein when an oscillation of said workpiece about the axis of rotation thereof occurs due to eccentricity of said workpiece, said focused ion beam is deflected in accordance with said oscillation while processing said workpiece.

4. An ion beam processing apparatus comprising:
rotatable holder means for holding a workpiece, said holder means being rotatable about an axis;
an ion beam source for applying a focused ion beam to said workpiece; and
control means for controlling said rotatable holder means and said ion beam source;
wherein an amount of deflection of said focused ion beam is varied in accordance with a rotational angular position of said rotatable holder means, and said rotatable holder means includes a chuck for correcting a very small eccentricity of a rotation axis of said workpiece.

5. A method according to claim 1, wherein the speed of rotation of said workpiece is periodically varied in accordance with the rotational angular position of said rotating workpiece.

* * * * *